United States Patent
Drooghaag

(10) Patent No.: US 9,188,621 B2
(45) Date of Patent: Nov. 17, 2015

(54) IMPAIRMENTS IDENTIFICATION MODULE AND METHOD

(75) Inventor: Benoit Drooghaag, Ophain-Bois-Seigneur-Isaac (BE)

(73) Assignee: Alcatel Lucent, Boulogne-Billancourt (FR)

( * ) Notice: Subject to any disclaimer, the term of this patent is extended or adjusted under 35 U.S.C. 154(b) by 434 days.

(21) Appl. No.: 13/639,032

(22) PCT Filed: Apr. 28, 2011

(86) PCT No.: PCT/EP2011/056791
§ 371 (c)(1),
(2), (4) Date: Dec. 3, 2012

(87) PCT Pub. No.: WO2011/135053
PCT Pub. Date: Nov. 3, 2011

(65) Prior Publication Data
US 2013/0154664 A1     Jun. 20, 2013

(30) Foreign Application Priority Data

Apr. 28, 2010    (EP) .................................. 10305447
Oct. 29, 2010    (EP) .................................. 10306190

(51) Int. Cl.
*H04M 1/24*     (2006.01)
*H04M 3/08*     (2006.01)
*H04M 3/22*     (2006.01)
*G01R 31/08*    (2006.01)
*H04B 3/46*     (2015.01)
(Continued)

(52) U.S. Cl.
CPC ...... *G01R 31/08* (2013.01); *H04B 3/46* (2013.01); *H04B 3/487* (2015.01); *H04M 3/306* (2013.01)

(58) Field of Classification Search
CPC ........ H04M 3/306; H04M 1/24; H04M 3/08; H04M 3/22; H04M 3/26
USPC .......... 379/1.01, 1.03, 1.04, 21, 22.01–22.03, 379/27.03, 29.01
See application file for complete search history.

(56) References Cited

U.S. PATENT DOCUMENTS 2,209,064 A     7/1940   Nyquist
4,113,998 A *   9/1978   Ashdown et al. .......... 379/29.03
5,699,402 A *   12/1997   Bauer et al. ................ 379/29.09
(Continued)

OTHER PUBLICATIONS

Boets P. et al: "Preprocessing of signals for single-ended subscriber line testing", IEEE Transactions on Instrumentation and Measurement IEEE USA, [Online] vol. 55, No. 5,—Oct. 2006, pp. 1509-1518, XP002605057, ISSN: 0018-9456.
(Continued)

*Primary Examiner* — Quoc D Tran
(74) *Attorney, Agent, or Firm* — Harness, Dickey & Pierce, P.L.C.

(57) ABSTRACT

A method to identify impairments in telecommunication lines i, j, k, . . . of a binder includes globally performing Single-Ended Line Testing SELT on the lines of the bundle. The method further includes applying an input signal in a first mode out of a multi-mode group including at least one differential mode for a respective line of the bundle and including at least one phantom mode for a respective pair of lines of the bundle. The method further includes measuring an echo signal E in a second mode out of the multi-mode group, the second mode being different of the first mode, and analyzing the echo signal in view of the input signal for deriving therefrom the searched impairments.

10 Claims, 3 Drawing Sheets

(51) Int. Cl.
*H04M 3/30* (2006.01)
*H04B 3/487* (2015.01)

(56) References Cited

U.S. PATENT DOCUMENTS

| | | | |
|---|---|---|---|
| 6,055,297 A * | 4/2000 | Terry | 379/1.01 |
| 7,012,991 B1 * | 3/2006 | Faulkner | 379/1.04 |
| 8,081,736 B2 * | 12/2011 | Blechschmidt et al. | 379/24 |
| 2002/0172329 A1 * | 11/2002 | Rashid-Farrokhi et al. | 379/22.02 |
| 2003/0112967 A1 * | 6/2003 | Hausman et al. | 379/417 |
| 2005/0163287 A1 * | 7/2005 | Ouyang et al. | 379/3 |

OTHER PUBLICATIONS

Neus C et al: "Transfer Function Estimation of Digital Subscriber Lines with Single Ended Line Testing", Instrumentation and Measurement Technology Converence Proceddings, 2007 IEEE, IEEE May 1, 2007, pp. 1-5, XP031182383, ISPN: 978-1-4244-0588-6.

Foubert W et al: "Modeling and validation of the parameters of a quad cable for common mode DSL applications", Signal Processing and Communication Systems, 2008. ICSPS 2008. 2ND International Conference on, IEEE, Piscataway, NJ, USA, Dec. 15, 2008, pp. 1-6, XP031448731 ISBN: 978-1-4244-4243-0.

* cited by examiner

IMPAIRMENTS IDENTIFICATION MODULE AND METHOD

The present invention relates to a method to identify impairments in telecommunications lines of a binder and to an impairments identification module realizing such a method.

Such a method and module are already known in the art. Indeed, with the availability of Triple Play services over copper access telecommunication networks such as e.g. Digital Subscriber Lines DSL, the reliability of the network becomes more and more critical. Telecom operators deploying video services over their existing copper pairs network are looking for efficient tools able to detect and moreover localize impairments such as bad contacts or water in the cable.

To solve this problem, different techniques are known in the art under the Single Ended Line Testing SELT denomination. Indeed, methods to identify impairments in telecommunication lines of a binder, comprises a step of performing Single Ended Line Testing SELT on the lines of the bundle.

Figure 1:
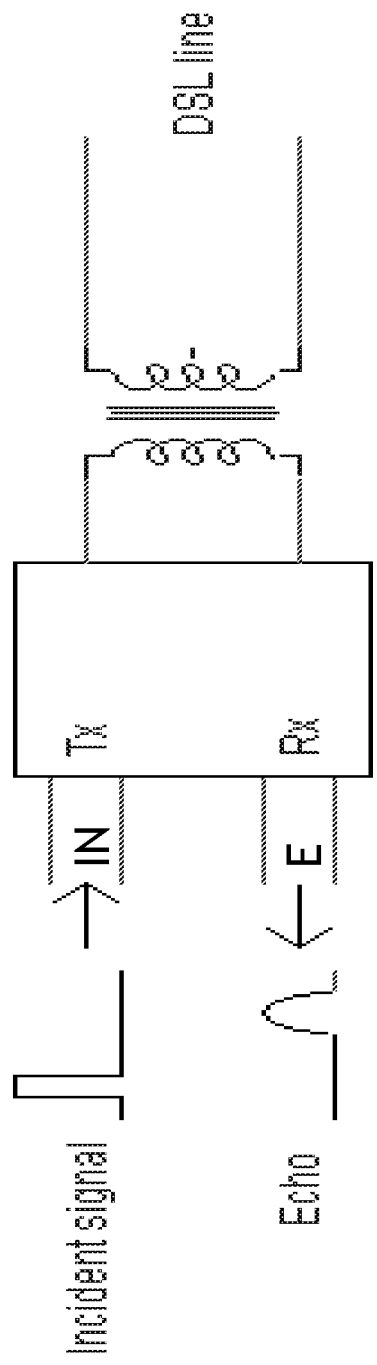

A well known technique is called Time Domain Reflectometry TDR. TDR consists in sending a signal over a twisted pair and in measuring the received echo over the time. A schematic view of TDR is shown in FIG. 1. An input signal, also called incident signal, is applied to a copper line via the TX input and an echo signal is measured via the RX output. The obtained measurements are often called reflectogram. At any, even light, impedance change of the line, the reflected echo level will vary, which will appear as a 'peak' or a 'valley' in the echo measurement. When using this technique, any impairment such as bad contact, a bridge tap or wire gauge change will become visible in the reflectogram. Once the time-domain echo is measured, the distance to the fault can be calculated. Indeed, when knowing the velocity of the electric signal on the line and keeping in mind that the distance covered by the signal is twice the distance to the fault, since the signal has to go to the event and come back to the emitter, the distance to the fault can be determined.

Another known method is called Frequency Domain Reflectometry FDR. This technique consists in measuring the amplitude and the phase of the echo signal in function of the frequency. Practically, the echo can be measured separately for each required frequency, called frequency sweep, or for all the frequencies at a time whereby the emitted signal is a broadband signal. The result is a bode diagram of the reflection coefficient with amplitude and phase versus frequency. Such a diagram is more complex to interpret since a single impairment will appear as a series of regularly-spaced bumps or holes in the echo amplitude.

Since the echo phase is available, it is often easier to transform the frequency-domain echo signal into a time-domain reflectogram by applying an inverse Fourier transform. In this way it can be interpreted as any other reflectogram measured using time-domain reflectometry.

For both time-domain and frequency-domain reflectometry, the result is affected by real impairments such as bad contact or water in the cable but also by so called normal imperfection like wire gauge changes or bridged tap. It is not easy to determine whether a peak in the reflectogram corresponds to a real problem or whether it is only due to splice between two cables, a gauge change, or a bridged tap which may be inherent to the network topology.

An object of the present invention is to provide a method and module to identify impairments in telecommunication lines of a binder such as the above known types but wherein the reliability and the accuracy of the detection and localization of the most frequent impairments of copper pairs networks is significantly increased.

According to the invention, this object is achieved due to the fact that the input signal and the echo signal are applied and measured between two different modes of a bundle of lines being differential mode and/or phantom mode. This is realized by performing a SELT whereby an input signal is applied in a first mode out of a multi-mode group. The multi-mode group comprises at least one differential mode for a line of the bundle and at least one phantom mode for a pair of lines of the bundle. Furthermore the echo signal is measured in a second mode from this multi-mode group which is different from the first mode. Finally the measured echo signal is analyzed in view of the input signal for deriving there from the impairments.

This method is realized by means of an impairments identification module which is adapted to identify impairments of telecommunications lines of a binder. The module comprises a multi-mode group of modules with at least one differential mode module for a respective line of the bundle and adapted to apply an input signal in a differential mode and to measure an echo signal in a differential mode; and at least one phantom mode module for a respective pair of lines of the bundle adapted to apply such input signal in a phantom mode and to measure such echo signal in a phantom mode. The impairments identification module further comprises a control means adapted to control, during execution of one cycle of Single-Ended Line Testing SELT on the lines of the bundle, the application of the input signal to a first module of the multi-mode group of modules and to control measurement from a second module of the multi-mode group of modules whereby the second module is different from the first module. Finally the impairments identification module comprises a processing unit adapted to analyze the measured echo signal in view of the input signal for deriving therefrom the impairments.

It has to be explained that a differential mode for a line is the transmission of information in the normal mode i.e. by means of two complementary signals sent on the two separate wires of the line.

Furthermore, the phantom mode for a pair of lines is measured, instead of differentially between the two wires of one pair, differentially between one pair and another pair. In other words the phantom mode measurement is the differential measurement of the common mode of one pair with the common mode of another pair.

It has to be explained that the above mentioned multi-mode group comprises:
a) at least one differential mode for each considered respective line i.e. for one or more lines of the bundle with maximum of n differential modes for a bundle with n lines; and
b) at least one phantom mode for each considered respective pair of lines i.e. for one or more pairs of lines of the bundle with a maximum of (n−1) independent phantom modes for a bundle with n lines.

In the event of using indeed the maximum available modes the multi-mode group comprises a total of (n)+(n−1)=(2n−1) modes This present method and impairments identification module is based on the insight that 'normal' impairments of copper pairs such as wire gauge change or bridged-tap are symmetric with regards to the two wires of a pair. In other words, the impedance variation due to a wire gauge change is the same for the two wires of one pair. So, these symmetric impairments are not causing a mode conversion. This means that for a cable without any problems, where e.g. all the lines are of good quality, when a signal is sent in a given mode such as differential or phantom one, all the power contained in that signal is nearly entirely transmitted within that mode. There will be nearly no part of the signal 'leaking' to another mode (differential or phantom one).

On the other hand, 'real' problems such as a bad contact will introduce an asymmetry between the impedance of the two wires of a line. Due to the asymmetry of the two wires, a mode conversion of the signal will be caused. Indeed, for a cable having an unbalance i.e. an asymmetry problem, that impacts some of its lines, such as bad contacts or water ingress, when a signal is sent in a given mode e.g. differential or phantom one, a fraction of that signal will 'leak' to all the other modes (differential or phantom ones) that are existing between the lines that suffer from the same problem. This phenomena is called 'mode conversion'.

So, for a good, well-balanced symmetric line, the proportion of the signal converted between e.g. differential mode and phantom mode is very low. However, if the line is unbalanced due to bad wire quality, water in the cable or bad contacts, then this ratio can be seriously degraded and a more important part of the signal will be converted from one mode to the other one.

Thanks to this phenomena and the insight that if an echo is measured in another mode than the emitted signal, the obtained reflectogram will only show the asymmetric impairments causing a mode conversion such as bad contact, water, all kinds of unbalanced faults and not the symmetric 'normal' impairments inherent to copper pairs network topology such as wire gauge change, splices, bridged tap. Hereby, a reflectogram is obtained that will provide an accurate localization of problems such as bad contacts and water in the cables without being sensitive to 'normal' impairments such as wire gauge change or bridged tap.

So, the method to identify impairments being realized by means of the impairments identification module of the present application is able to detect and localize field impairments affecting copper pairs network such as bad contact, water in the cable or all kinds of unbalanced faults. A big advantage comparing to prior solutions is that the new proposed method is insensitive to normal impairments inherent to copper network topology such as wire-gauge changes.

Furthermore, when the step of measuring a second mode and analyzing the echo signal is repeated for every mode of the multi-mode group that is different of the first mode a complete view of real impairments for the whole bundle can be determined.

It has to be noted here that indeed for a system of n pairs, it is possible to measure (2n−1)*(2n−1) reflectograms. However, the reflectograms that are computed by using the reflected signal being measured in the same mode as the incident signal are corresponding to the "traditional" single-mode reflectometry. These results will be sensible to any kind of impairments including wire gauge change, while all the other reflectograms are the present defined multi-mode reflectograms which are sensible to impairments that are causing a mode conversion like bad contacts, insulation default between adjacent pairs or water ingress.

This technique of applying and measuring according to different modes can be either based in time-domain or frequency-domain whereby, respectively, time domain reflectometry and frequency domain reflectometry are used. Similar to the classical reflectometry, a time-domain measure provides directly the reflectogram while a frequency-domain measure provides a bode diagram (magnitude and phase versus frequency), that can be converted to a reflectogram by applying an inverse Fourier transform.

Furthermore, the telecommunication lines are by preference digital subscriber Lines DSL lines.

One possible implementation of the present impairments identification module is that the impairments identification module is located in a telecommunication DSL Modem.

Another possible implementation for the impairments identification module is that the impairments identification module is located in a telecommunication access node.

Finally the impairments identification module can be realized according to a distributed way whereby the processing unit of the impairments identification module is located in a server of the telecommunication network. In this way the processing unit is a dedicated measuring device.

Such a server e.g. a remote server having access to the management network of the telecommunication node, can be placed anywhere in the network and receives the information regarding the measured echo signals when knowing as well the applied input signals.

It is to be noticed that the term 'comprising', used in the claims, should not be interpreted as being limitative to the means listed thereafter. Thus, the scope of the expression 'a device comprising means A and B' should not be limited to devices consisting only of components A and B. It means that with respect to the present invention, the only relevant components of the device are A and B.

Figure 2:
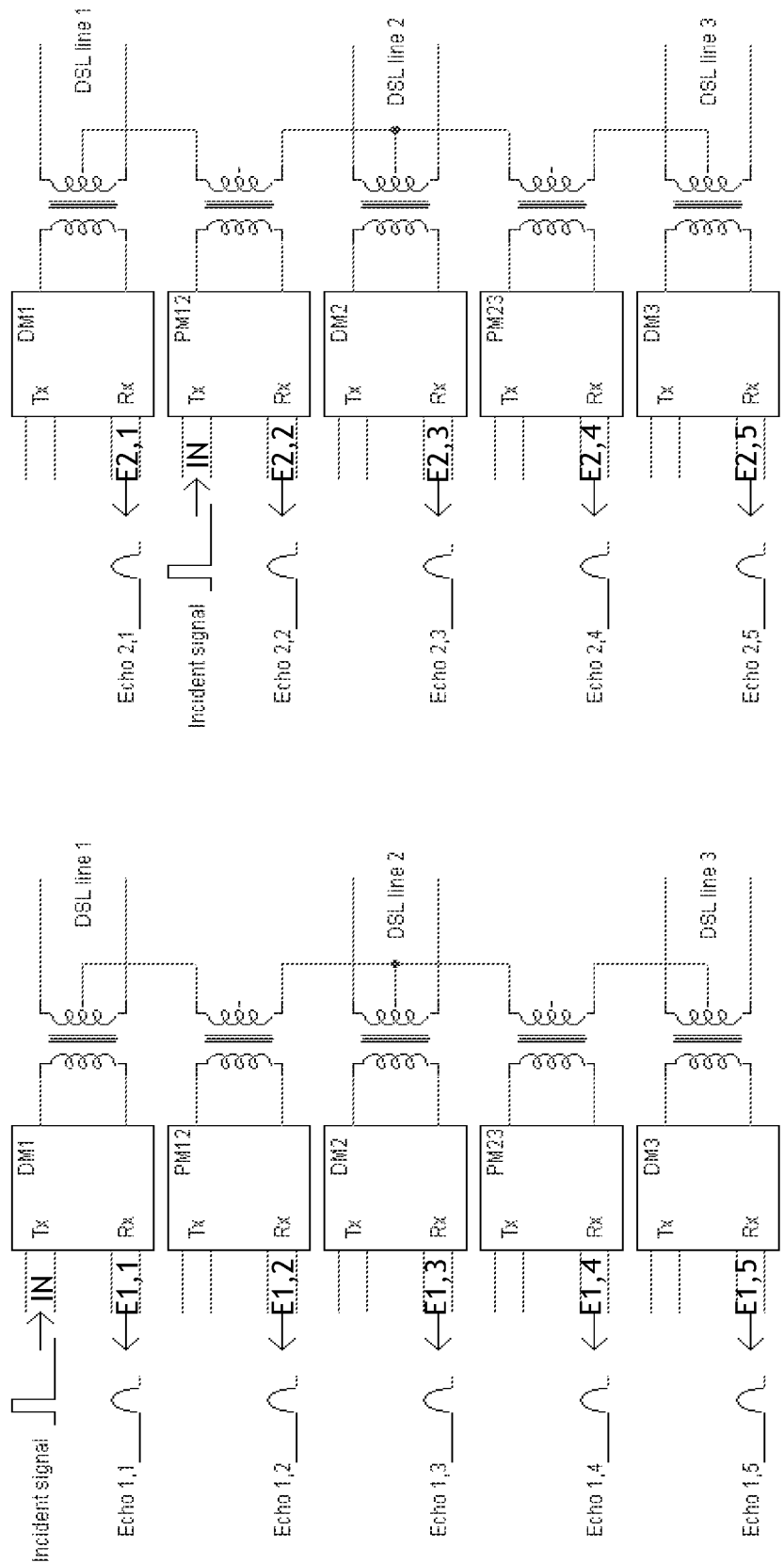
Figure 3:
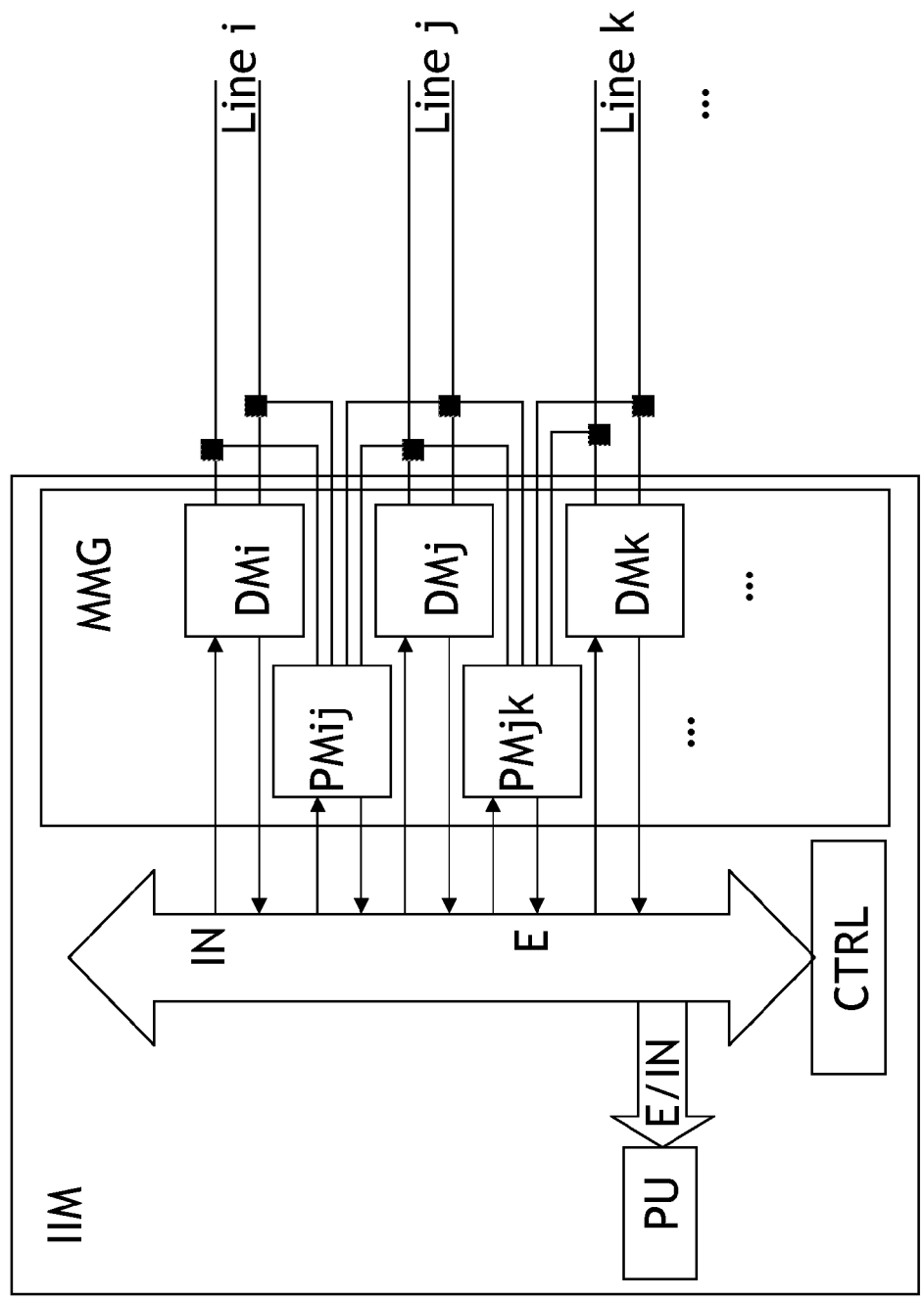

The above and other objects and features of the invention will become more apparent and the invention itself will be best understood by referring to the following description of an embodiment taken in conjunction with the accompanying drawings wherein FIG. 1 represents a schematic view of traditional Single Ended Line Testing SELT, FIGS. 2a and 2b are representing each a schematic view of the actual multi-mode Single Ended Line Testing and FIG. 3 represents an impairments identification module in a telecommunication network according to the present invention.

The working of the device according to the present invention in accordance with its telecommunication environment that is shown in FIGS. 2a and 2b and FIG. 3 will be explained by means of a functional description of the different blocks shown therein. Based on this description, the practical implementation of the blocks will be obvious to a person skilled in the art and will therefor not be described in details. In addition, the principle working of the method to identify impairments in telecommunication lines will be described in further detail.

Referring to FIG. 1 and as mentioned above, a schematic view of traditional Single Ended Line Testing SELT is shown in a Digital Subscriber Line telecommunication network i.e. mores specific of Time Domain Reflectometry. One DSL line is shown upon which an incident signal IN is applied at the TX transmit side and a reflected signal i.e. echo-signal is measured at the RX receiving side. In the event when the applied signal encounters an impairment the reflected echo level will vary, which will appear as a 'peak' or a 'valley' in the echo measurement. Any real impairment such as bad contact or water in the cable but also normal impairments, inherent to the network topology, such as a bridge tap or wire gauge change becomes visible in the reflectogram. As explained above, due to the present method and impairment identification module, reflectorgrams are generated that show only the real impairments due to e.g. bad contact or water in the cable.

Referring to FIGS. 2a and 2b the solution of the present application will be explained for a bundle with 3 DSL lines. Firstly, the multi-mode group is explained. Based upon the present example the bundle provides the following transmit mode possibilities:

a) at least one differential mode for each considered respective line of the bundle. In the event of considering and taking into account each DSL line, 3 differential modes can be defined i.e. DM1, DM2 and DM3. The schematic representation in FIGS. 2a and 2b shows hereby 3 functional blocks each one coupled to a respective DSL line and being enabled to transmit and/or receive an applied incentive signal, called input signal IN and/or measure an output signal, called echo-signal E, according to the Differential Mode: DM1, DM2 and DM3.

b) at least one phantom mode for each considered respective pair of lines of the bundle. In the event of considering and taking into account each possible pair of DSL lines 3 Phantom Modes can be defined i.e. PM12, PM23 and PM31 (not shown). However, since the $3^{rd}$ Phantom Mode can be calculated in function of the 2 others i.e. only 2 independent Phantom Mode are considered i.e. according to the present example PM12 and PM23 are shown. Indeed the schematic representation in FIG. 2 shows hereby 2 functional blocks each coupled between a respective pair of lines in the binder and enabled to transmit and/or receive an applied incentive signal, called input signal IN and/or measure an output signal, called echo-signal E, according to the Phantom Mode: PM12 and PM23.

In this way the multi-mode group in the present example comprises the following different modes: DM1, DM2, DM3, PM12 and PM23.

According to the present application, in a first step, an input signal IN is provided to one of the available functional blocks representing each one of the above described modes. The input signal IN is applied to the binder according to the respective mode of the functional mode block, hereafter called first mode. In a second step the reflected signal E is measured at one of the available functional blocks and is measured according to the respective mode of the functional block, hereafter called second mode. Hereby, the second mode must be different from the first mode.

In a third step the measurements of the echo signal are analyzed in view of the input signal for deriving therefrom the searched impairments.

Two Examples are shown in FIGS. 2a and 2b.

FIG. 2a shows an input signal IN at the first Differential Mode of the first DSL Line 1 i.e. DM1.

Although it is sufficient to execute measurements for only one second mode, by executing the measurements for different second modes, more reflectograms will be measured whereby an improved potential for a better and more accurate analysis is generated. The different possibilities for tests with incentive IN at DM1 are:

E1,2 with DM1(IN) and measured at PM12(E)
E1,3 with DM1(IN) and measured at DM2(E)
E1,4 with DM1(IN) and measured at PM23(E)
E1,5 with DM1(IN) and measured at DM3(E)

FIG. 2b shows an input signal IN a the Phantom Mode between the first DSL line 1 and the second DSL Line 2 i.e. PM12. Here are the different possibilities for the different tests with incentive IN at PM12:

E2,1 with PM12(IN) and measured at DM1(E)
E2,3 with PM12(IN) and measured at DM2(E)
E2,4 with PM12(IN) and measured at PM23(E)
E2,5 with PM12(IN) and measured at DM3(E)

It has to be remarked that FIGS. 2a and 2b also show each time the classical SELT. In this way FIG. 2a shows the possible test E1,1 with DM1(IN) and measured at DM1(E) and FIG. 2b shows the possible test E2,2 with PM12(IN) and measured at PM12(E)

Referring to FIG. 3 an Impairment Identification Module IIM is shown in its telecommunication environment i.e. coupled to n DSL lines in a binder whereof three are shown and called Line i, Line j and Line k. The impairments identification module IIM comprises a multi-mode group of modules MMG. The multi-mode group of modules comprises:

at least one differential mode module DMi, DMj, DMk, . . . for a respective line i, j, k, . . . of the bundle. Each respective differential module is adapted to apply an input signal in a differential mode and adapted to measure an echo signal in a differential mode; and at least one phantom mode module PMij, PMjk, . . . for a respective pair of lines of the binder. Each respective phantom mode module is adapted to apply such input signal in a phantom mode and adapted to measure such echo signal in a phantom mode.

It has to be remarked that only 2 independent Phantom Mode Modules are shown here.

The impairments identification module IIM further comprises a control means CTRL coupled to each one of the modules of the multi-mode group. The control means CTRL is adapted to control, during execution of one cycle of a Single-Ended Line Testing SELT on the lines of the bundle, application of an input signal IN to a first module of the modules of the multi-mode group MMG and to control measurement from a second module of the modules of the multi-mode group MMG. Hereby, the control means is adapted to ensure that for one cycle of Single Ended Line Testing the second module for measurement is different from the first module.

The impairments identification module IIM further comprises a processing unit PU which is coupled to the control means CTRL and the different modules of the multi-mode group MMG. The processing unit PU is adapted to receive the measured echo signal E and to analyze the signal E in view of the input signal IN for deriving therefrom the searched impairments.

The method to identify impairments in the telecommunication lines Line i, Line j and Line k of the binder comprises the global step of performing Single-Ended Line Testing SELT on these lines of the bundle. Furthermore the method comprises a first step of applying an input signal IN in a first mode out of the multi-mode group to a first module of the multi-mode group of modules and a second step of measuring an echo signal E in a second mode out of the multi-mode group by means of a second module of the multi-mode group of modules. Hereby the second mode executed by the second module is different from the first mode executed by the first module. In a third step the received echo-signal E is analyzed in view of the input signal IN for deriving therefrom the searched impairments.

A final remark is that embodiments of the present invention are described above in terms of functional blocks. From the functional description of these blocks, given above, it will be apparent for a person skilled in the art of designing electronic devices how embodiments of these blocks can be manufactured with well-known electronic components. A detailed architecture of the contents of the functional blocks hence is not given.

While the principles of the invention have been described above in connection with specific apparatus, it is to be clearly understood that this description is made only by way of example and not as a limitation on the scope of the invention, as defined in the appended claims.

The invention claimed is:

1. A method to identify impairments in telecommunication lines of a bundle, said method comprising:

performing Single-Ended Line Testing SELT on said lines of said bundle;

applying an input signal in a first mode out of a multi-mode group comprising at least one differential mode for a respective line of said bundle and comprising at least one phantom mode for a respective pair of lines of said bundle; and measuring an echo signal in a second mode out of said multi-mode group being different of said first mode; and analyzing said echo signal in view of said input signal for deriving therefrom impairments.

2. The method of claim 1, further comprising:

repeating said measuring in a second mode and analyzing said echo signal for every mode of said multi-mode group being different of said first mode.

3. The method of claim 1, wherein time domain reflectometry is used.

4. The method of claim 1, wherein frequency domain reflectometry is used.

5. The method of claim 1, wherein said telecommunication lines are DSL lines.

6. An impairments identification module configured to identify impairments of telecommunications lines of a bundle, wherein said impairments identification module comprises:

a multi-mode group of modules including, at least one differential mode module for a respective line of said bundle configured to apply an input signal in a differential mode and adapted to measure an echo signal in a differential mode; and at least one phantom mode module for a respective pair of lines of said bundle configured to apply such input signal in a phantom mode and adapted to measure such echo signal in a phantom mode; and control means for controlling, during execution of one cycle of Single-Ended Line Testing SELT on said lines of said bundle, application of said input signal to a first module of said modules of said multi-mode group of modules and for controlling measurement from a second module of said modules of said multi-mode group of modules, said second module being different from said first module; and a processing unit configured to analyze said measured echo signal in view of said input signal for deriving therefrom impairments.

7. The impairments identification module according to claim 6, wherein said impairments identification module is located in a telecommunication DSL Modem.

8. The impairments identification module according to claim 6, wherein said impairments identification module is located in a telecommunication access node.

9. The impairments identification module according to claim 6, wherein said processing unit being comprised in a server of the telecommunication network.

10. The impairments identification module according to claim 6, wherein said processing unit is a dedicated measuring device.

* * * * *